United States Patent [19]
Pollard

[11] Patent Number: 6,034,322
[45] Date of Patent: Mar. 7, 2000

[54] SOLAR CELL ASSEMBLY

[75] Inventor: Howard E Pollard, Saratoga, Calif.

[73] Assignee: Space Systems/Loral, Inc., Palo Alto, Calif.

[21] Appl. No.: 09/346,272

[22] Filed: Jul. 1, 1999

[51] Int. Cl.$^7$ ...................................................... E03B 11/00
[52] U.S. Cl. .......................... 136/256; 136/244; 136/293
[58] Field of Search .................................... 136/244, 249, 136/251, 256, 259, 293

[56] References Cited

U.S. PATENT DOCUMENTS

| | | | |
|---|---|---|---|
| 3,472,698 | 10/1969 | Mandelkorn | 136/89 |
| 4,121,965 | 10/1978 | Leipold | 156/608 |
| 4,164,432 | 8/1979 | Boling | 136/89 |
| 4,350,836 | 9/1982 | Crouthamel et al. | 136/244 |
| 4,357,486 | 11/1982 | Blieden et al. | 136/247 |
| 4,491,681 | 1/1985 | Kirpich | 136/246 |
| 4,577,051 | 3/1986 | Hartman | 136/244 |
| 4,652,693 | 3/1987 | Bar-On | 136/251 |
| 4,766,471 | 8/1988 | Ovshinsky et al. | 357/19 |
| 5,006,179 | 4/1991 | Gaddy | 136/244 |
| 5,185,042 | 2/1993 | Ferguson | 136/244 |
| 5,567,248 | 10/1996 | Chung | 136/244 |

*Primary Examiner*—Nam Nguyen
*Assistant Examiner*—Michael C. Miggins

*Attorney, Agent, or Firm*—Perman & Green, LLP

[57] ABSTRACT

A solar cell assembly with current limiting protection comprises a rectangular planar solar cell having four corner locations including first and second opposed surfaces and a beveled edge at one of the corner locations. Parallel spaced longitudinally extending conductors are provided on a first opposed surface and a metallic coating overlies an entire second opposed surface. Interconnect members mount a protective bypass diode, electrically intermediate and in series with the first and second conductor members, on the solar cell in a mutually coplanar relationship proximate to but spaced from the beveled edge, accommodating relative in-plane motion between the bypass diode and the solar cell. The interconnect members include an upper interconnect member extending between and fixed, respectively, to a first metallic pad member on the first opposed surface adjacent the beveled edge and electrically connected to the bus member and to a first surface of the bypass diode and a lower interconnect member extending between and fixed, respectively, to a second metallic pad member mounted adjacent the beveled edge and electrically connected to the metallic coating and to a second surface of the bypass diode. A protective glass sheet overlies and is bonded to the first opposed surface of the solar cell and the bypass diode in a generally coextensive relationship. A supplemental reinforcement sheet member may overlie a portion of the second opposed surface of the solar cell and the bypass diode and be bonded thereto in a generally coextensive relationship.

17 Claims, 7 Drawing Sheets

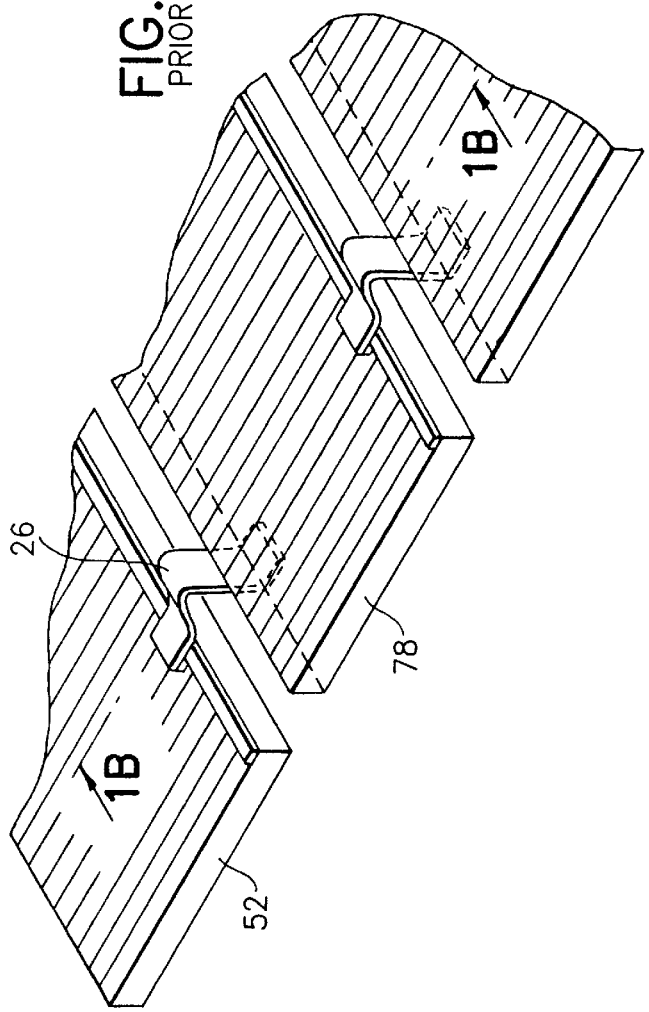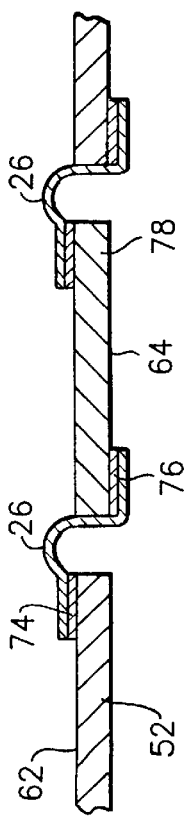

SOLAR CELL ASSEMBLY

BACKGROUND OF THE INVENTION

1. Field of the Invention

The present invention relates to solar panels for use in spacecraft and, more particularly, to solar cell assemblies which are the building blocks of solar panels and, still more particularly, to a unique robust construction of a solar cell assembly with significant cost and efficiency benefits.

2. Description of the Prior Art

Since the launch of Vanguard I on Mar. 17, 1958, photovoltaic panels have been the primary source of power generation for earth orbiting satellites in the United States, Europe and Japan. Space solar arrays and satellite power demands have increased since Vanguard's 1 watt array to the present power of nearly 20,000 watts at launch. These solar arrays are composed of thousands of individual solar cells configured in a parallel and series arrangement to satisfy the voltage and current requirements.

The solar cells ere of either silicon or gallium arsenide designs, usually rectangular in shape, of dimensions typically 4 cm by 6 cm, although sizes from 2 by 4 cm to a by 8 cm are in use. These cells are quite thin, 150 $\mu$m to 200 $\mu$m thick, fragile and easily damaged. To protect the cell during the process of building the solar array a subassembly of the cell, a thin glass cover and an interconnector is usually constructed. This provides significant strength protects the top surface of the cell and can be more easily handled. This is called a CIC or Cover Integrated Cell. This is the electrical building block for circuit construction.

An exploded view of a CIC is illustrated in FIG. 1, indicated by reference numeral 20. On the surface of a cell 22 are discrete contact pads 24 to which the electrical contact is made. The upper surface of the pads are silver to permit ease of soldering or welding. Interconnects 26 for electrically joining circuitry on the cell 22 to an adjoining cell 28 are either pure silver or silver plated kovar, molybdenum or Invar. These latter materials provide a better thermal expansion match to the cell material. Silver is soft and compliant, not requiring a perfect match. Since the satellites are subjected to eclipse cycles on orbit, the temperature excursion of the solar array for geostationary spacecraft is between −175° C. and +60° C. This temperature variation causes relative motion between cells due to the thermal expansion and contraction of the solar cells. The interconnect is designed to be flexible to accommodate this relative motion as indicated by the loops in the figure.

The cell 22 with interconnects 26 is then protected by bonding a cover glass 30 with a clear silicone adhesive 31. The adhesive has to be clear and able to survive the space environment. Dow Corning 93-500 is the accepted adhesive in Asia, Europe and USA. Although not illustrated, the adjoining cell 28 would be similarly protected.

The assembly of the CIC 20 is usually a custom operation because of the variety of cell sizes and requirements. This requires the hand operation of trained personnel with minimum reliance on automated equipment. The assembly flow follows the sequence described above: place the cell on a vacuum holding fixture, weld or solder the interconnect using an automatic welder or solder machine, apply the adhesive in measured quantity using an automation adhesive dispenser, position the glass against alignment pins, place in a small vacuum chamber to pull any trapped bubbles out of the cell the in an oven set at about 50° C. to cure the adhesive. The CIC is then cleaned of any excess adhesive. Electrical and visual inspection is performed and the CICs sorted by power output.

Spacecraft power demands continue to increase resulting in correspondingly increased requirements for the capability of the photovoltaic solar panels. As the demands continue to increase, the solar array becomes significantly larger and less able to use the lower efficiency and lower cost silicon solar cells and must consider the gallium arsenide family on high efficiency III–V (groups within the Periodic Table) solar cells. These solar cells are significantly more expensive than silicon based solar cells in the initial fabrication but also must be protected from reverse bias breakdown and severe power loss due to current limiting. The current limiting is typically due to shadowing of the solar cells or cell breakage that reduces the active area. The method to prevent the reverse bias is to incorporate a diode across the solar cell junction to provide the required current path around the cell.

Additionally, due to the high cost of the basic solar cell, every effort should be made to utilize the most active area of the blank cell. The assembly of these components together with a cover glass and stress relieved electrical interconnector in a robust, cost effective method is the subject of this disclosure.

A very common substrate for the manufacture of solar cells for spacecraft application for both silicon and gallium arsenide type solar cells is round semiconductor material of 100 mm diameter. Although other diameters, such as 75 mm, 125 mm and 150 mm are also considered or in use, the technique described herein is equally applicable. FIG. 2, for example, illustrates a 100 mm diameter solar cell wafer 32 with two typical rectangular solar cells 34, 36. The size of the maximum square configuration within the 100 mm circle is 70 mm by 70 mm, ignoring any edge clearance requirement. This square provides two cells 35 mm by 70 mm, each defining the solar cell total area of 2,450 mm$^2$.

It was with knowledge of the foregoing state of the technology that the present invention has been conceived and is now reduced to practice.

SUMMARY OF THE INVENTION

A solar cell assembly with current limiting protection in accordance with the invention comprises a rectangular planar solar cell having four corner locations including first and second opposed surfaces and a beveled edge at one of the corner locations. Parallel spaced longitudinally extending conductors are provided on a first opposed surface and a metallic coating overlies an entire second opposed surface. Interconnect members mount a protective bypass diode, electrically intermediate and in series with the first and second conductor members, on the solar cell in a mutually coplanar relationship proximate to but spaced from the beveled edge, accommodating relative in-plane motion between the bypass diode and the solar cell. The interconnect members include an upper interconnect member extending between and fixed, respectively, to a first metallic pad member on the first opposed surface adjacent the beveled edge and electrically connected to the bus member and to a first surface of the bypass diode and a lower interconnect member extending between and fixed, respectively, to a second metallic pad member mounted adjacent the beveled edge and electrically connected to the metallic coating and to a second surface of the bypass diode. A protective glass sheet overlies and is bonded to the first opposed surface of the solar cell and the bypass diode in a generally coextensive relationship. A supplemental reinforcement sheet member may overlie a portion of the second opposed surface of the solar cell and the bypass diode and be bonded thereto in a generally coextensive relationship.

A primary feature, then, of the present invention is the provision of an improved solar cell assembly of a unique robust construction with significant cost and efficiency benefits.

Another feature of the present invention is the provision of such a solar cell assembly combining the cell interconnect, diode and cover glass in reduced cost configuration.

Still another feature of the present invention is the provision of such a solar cell assembly in which the specific cost in dollars-per-watt is reduced by 20 percent by improved utilization of the wafer area with an integrated interconnect and diode, efficiently interconnected into a circuit format and bonded to a solar panel substrate.

Yet another feature of the present invention is the provision of such an assembly in which a planar rectangular solar cell having four corner locations including first and second opposed surfaces and a beveled edge at one of the corner locations includes a bypass diode for protection of the solar cell and an interconnect construction mounting the bypass diode on the solar cell in a mutually coplanar relationship proximate to but spaced from the beveled edge and accommodating relative in-plane motion between the bypass diode and the solar cell.

Still a further feature of the present invention is the provision of such a solar cell assembly in which a protective glass sheet overlies and is bonded to the first opposed surface of the solar cell and the bypass diode in a generally coextensive relationship.

Yet a further feature of the present invention is the provision of such a solar cell assembly in which a supplemental reinforcement sheet member overlies a portion of the second opposed surface of the solar cell and the bypass diode and is bonded thereto in a generally coextensive relationship.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and together with the description, serve to explain the principles of the invention in general terms. Like numerals refer to like parts throughout the disclosure.

BRIEF DESCRIPTION OF THE DRAWINGS

FIG. 1A is a detail perspective view of the known construction illustrated in FIG. 1;

FIG. 1B is a cross section view taken generally along line 1B—1B in FIG. 1A;

DETAILED DESCRIPTION OF THE PREFERRED EMBODIMENTS

After initially exploring the options for placement of a bypass diode on a solar cell, that is, rear surface, front surface or corner, a corner location was selected for ease of manufacturing the composite assembly. Further, to provide sufficient area for a diode with consideration of current density for safe operating temperatures an area of 30 mm$^2$ to 40 mm$^2$ would be desirably selected.

Figure 3:
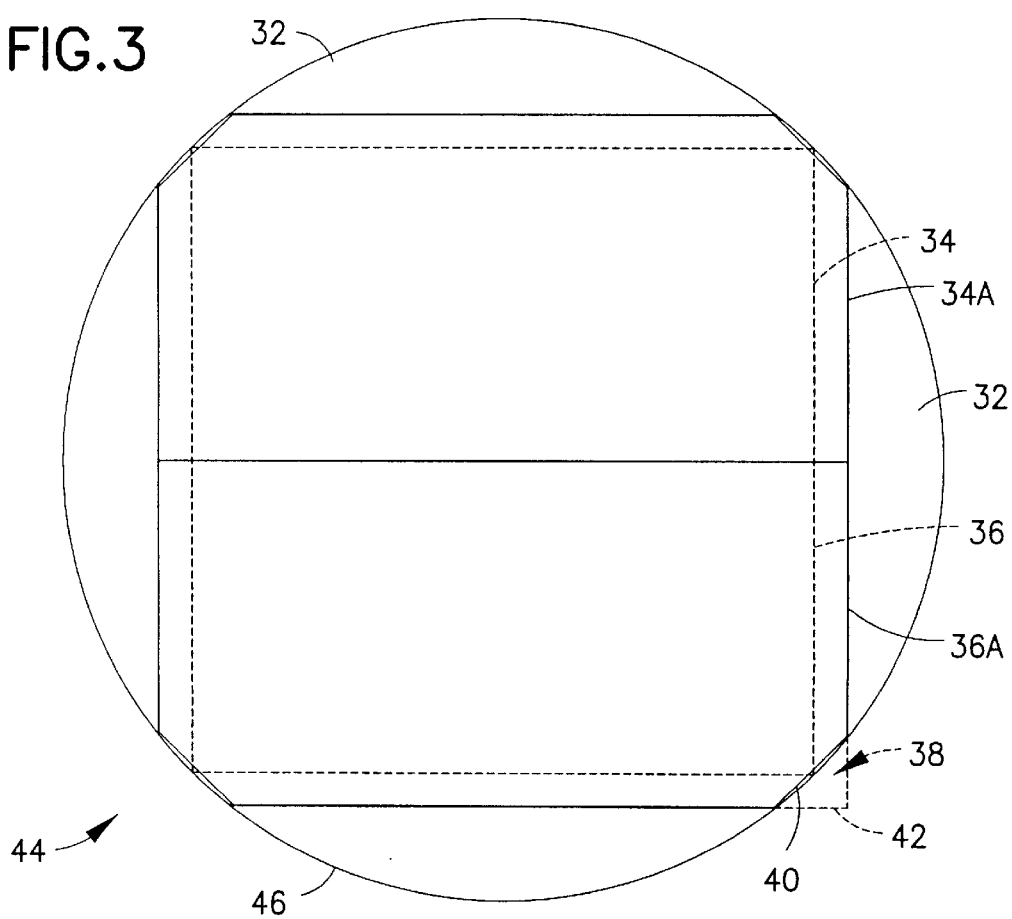
FIG. 3 is a top plan view, similar to FIG. 2, illustrating a modified shape of rectangular solar cells produced from the wafer, in accordance with the invention.

Viewing FIG. 3, such an adequate triangular area 38 can be obtained in a modified solar cell 36A (or 34A) by a 45° corner bevel 40 with legs 42 of about 8 to 9 mm in length. Even with the removal of an area similar to the area 38 from another corner 44 of the cell 36A adjacent to an edge 46 of the wafer, the size of the solar cell 36A can be significantly increased over that of the solar cell 36 with little, if any, increase in cell cost. The resulting two solar cells 36A, 34A on the 100 mm wafer 32 are clearly seen in FIG. 3. The area of these cells 36A, 34A is 2,807 mm$^2$ or nearly 22 percent larger than the maximum rectangular size represented by the solar cells 34, 36.

Figure 4:
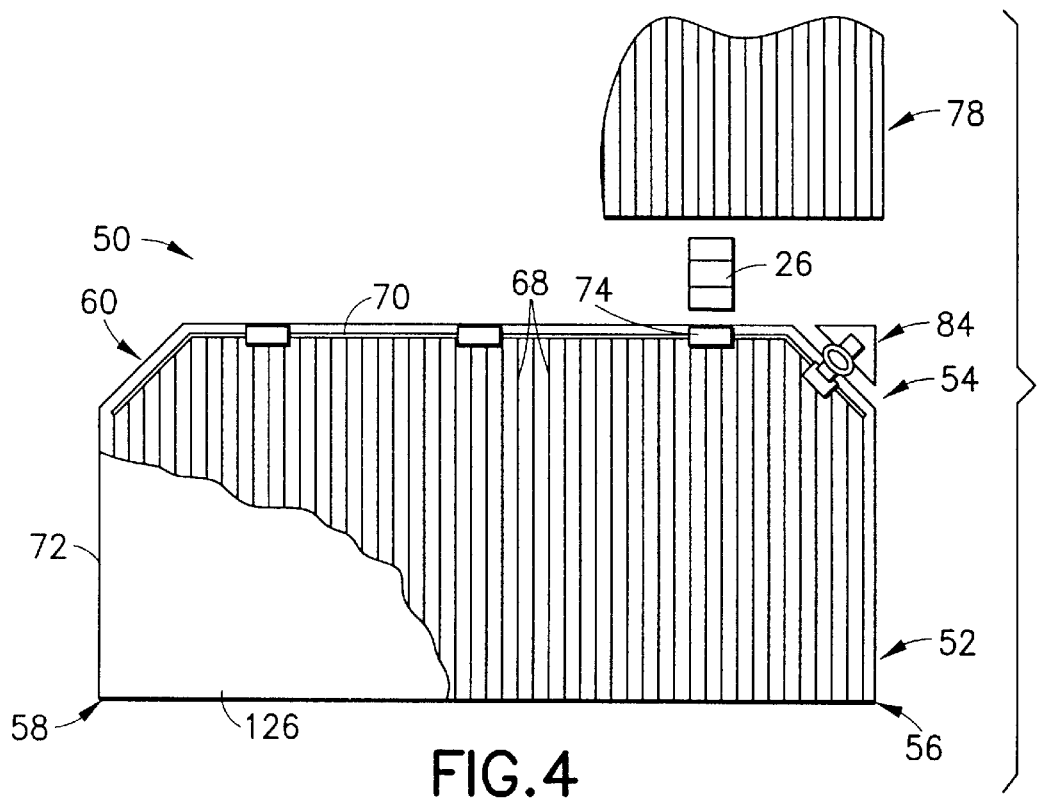
FIG. 4 is a top plan view, partially cut away, of adjoining solar cells, at least one of the solar cells being modified according to the invention.
Figure 4A:
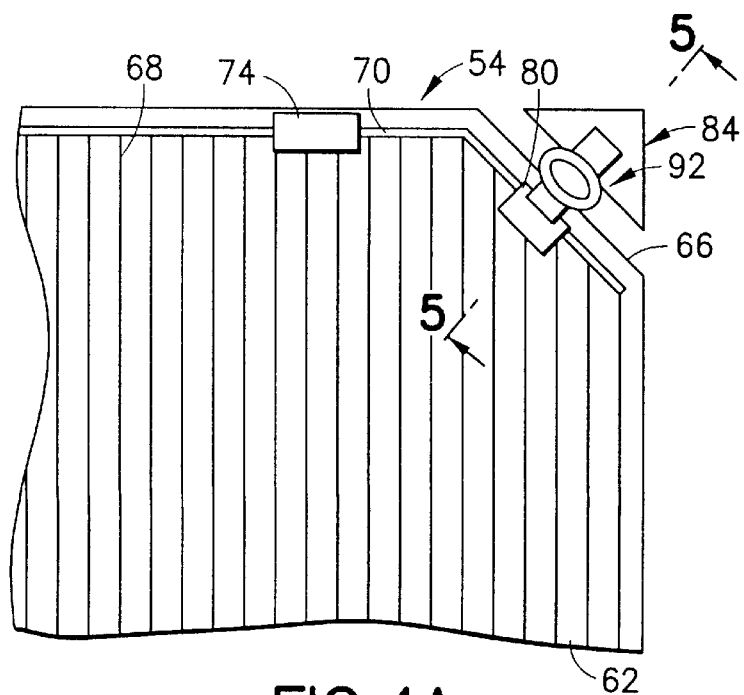
FIG. 4A is a detail top plan view illustrating a portion of FIG. 4 including a by-pass diode and an interconnect construction therefor.
Figure 4B:
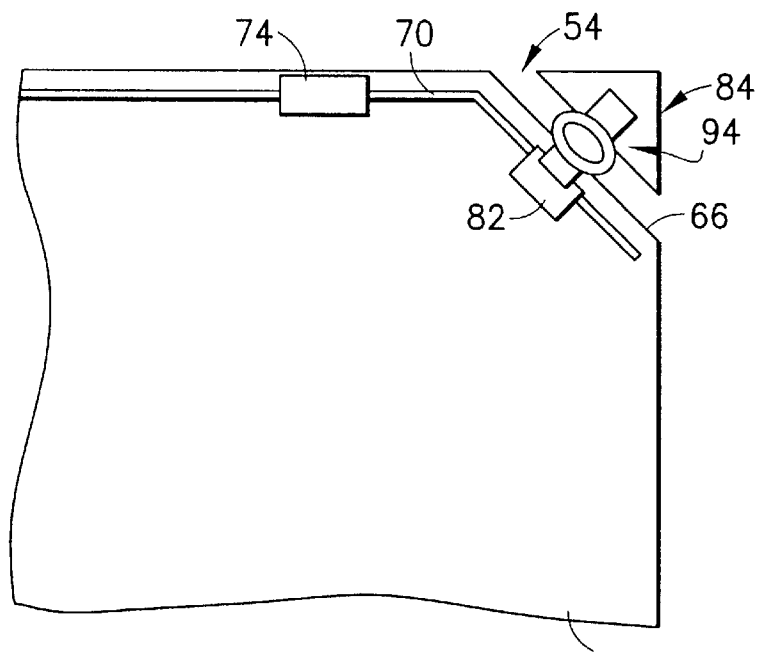
FIG. 4B is a detail bottom plan view of the components illustrated in FIG. 4A.
Figure 5:
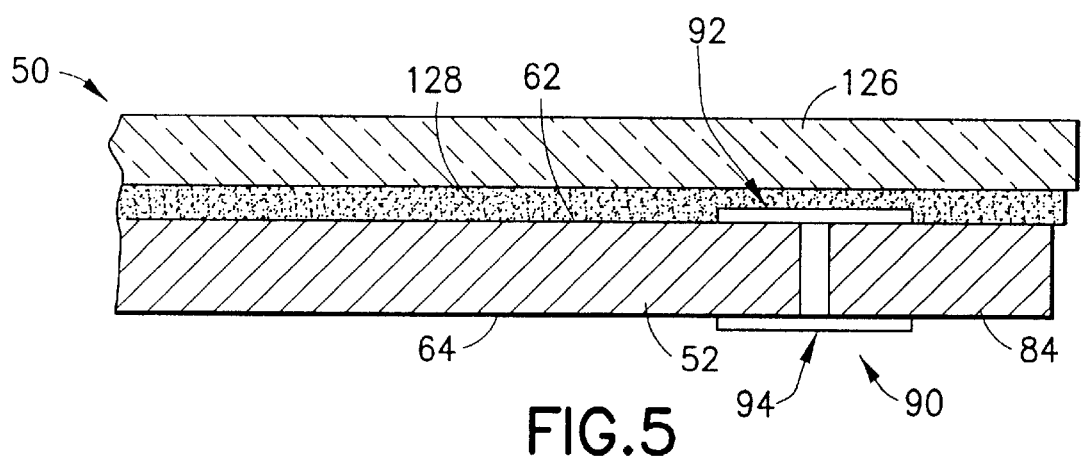
FIG. 5 is a detail side elevation view taken generally along line 5—5 in FIG. 4A.

This diode requires an in plane stress relief 90 (described below) to assure integrity of assembly during repeated thermal cycling. This detail is shown in FIGS. 4, 4A, and 4B. A flat silver interconnect is welded to the top surfaces of the diode and the cell and a similar interconnect is welded to the rear sides of the diode and cell. This assembly could be performed using soldering techniques. The diode interconnector could be incorporated into the cell-to-cell interconnector for simultaneous assembly or the diode could be purchased with interconnects attached for subsequent assembly to the cell Once assembled, the diode to cell interface is very fragile and generally requires mechanical support to prevent separation and damage. This support is provided by bonding the cover glass to the front surfaces of both the cell and diode. FIG. 5 shows a side view of the assembly.

Unfortunately, the cover glass is typically 75 μm to 150 μm thick for geostationary applications and very fragile and easily damaged during subsequent cleaning, measuring, circuit formation and panel laydown. The 150 μm glass is significantly stronger than the 75 μm and for higher radiation environments glass of 305 μm up to 508 μm are common and will require no additional support. If the thinner glass is desired for other considerations as mass reduction the use of chemically or thermally tempered glass is strongly recommended.

Turning now to FIG. 4, there is shown a top plan view of a solar cell assembly 50 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

Figure 1:
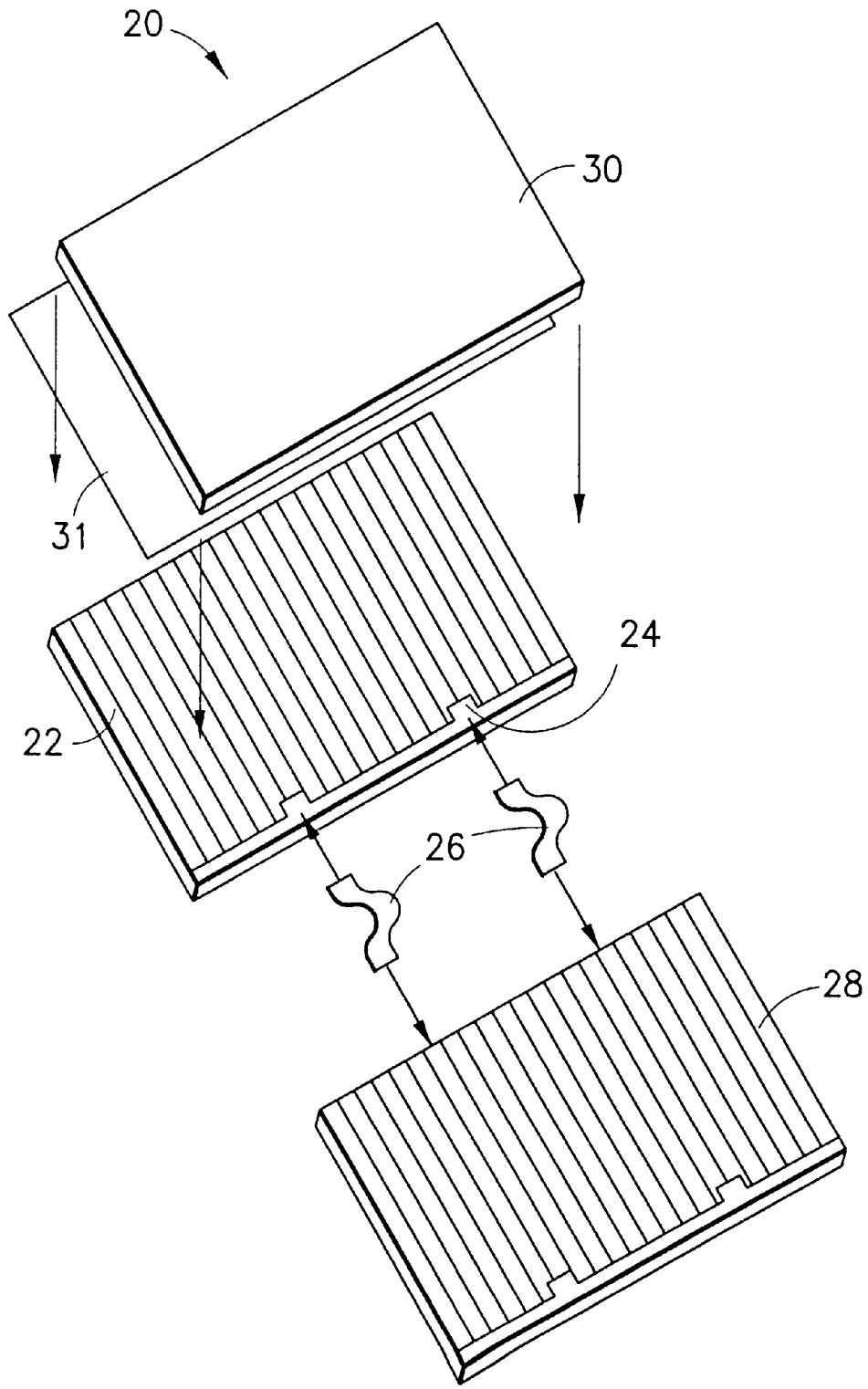
FIG. 1 is an exploded perspective view of a known construction of adjoining solar cells used with a solar panel.
Figure 2:
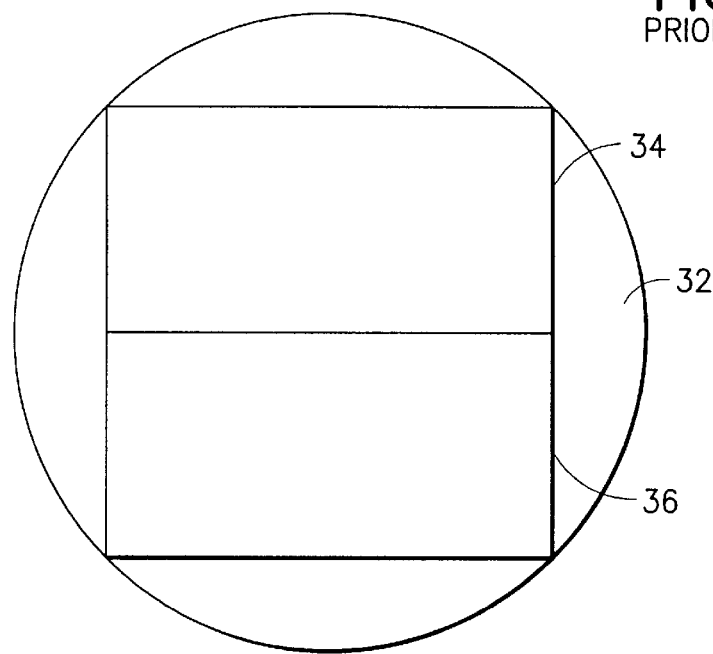
FIG. 2 is a top plan view illustrating a typical 100 mm diameter solar cell wafer from which two typical rectangular solar cells are produced.

The solar cell assembly 50 is provided with current limiting protection as will be described and includes a planar solar cell 52 generally of rectangular shape having four corner locations 54, 56, 58, 60 including first and second opposed surfaces 62, 64 (FIG. 5) and a beveled edge 66 (FIG. 4A) at the corner location 54. The solar cell 52 may be composed of the materials mentioned earlier and the surface 62, in customary fashion, is provided with a plurality of parallel spaced longitudinally extending conductors 68. Also on the surface 62, possibly adjoining an outer peripheral edge 72, a bus member 70 is in electrical continuity with each of the conductors 68. Viewing FIGS. 1A and 1B, a plurality of metallic contact pads 74 on the first opposed surface 62 of the solar cell 54, similar to the contact pads 24 (FIG. 1) for connecting to similar contact pads 76 (FIG. 4) on the second opposed surface 64 of an adjoining solar panel 78 are also provided on the surface 62. Adjacent the beveled edge 66 and also electrically connected to the bus member 70 on the surface 62 is another metallic pad member indicated by reference numeral 80, similar to the contact pads 74, 76, on the first opposed surface adjacent the beveled edge 66 and electrically connected to the bus member 70.

Also in customary fashion, a metallic coating overlies the entire opposed surface 64 (see FIG. 4B) and a second metallic pad member 82 is mounted on the surface 64 adjacent the beveled edge 66 and electrically connected to the metallic coating.

Figure 6:
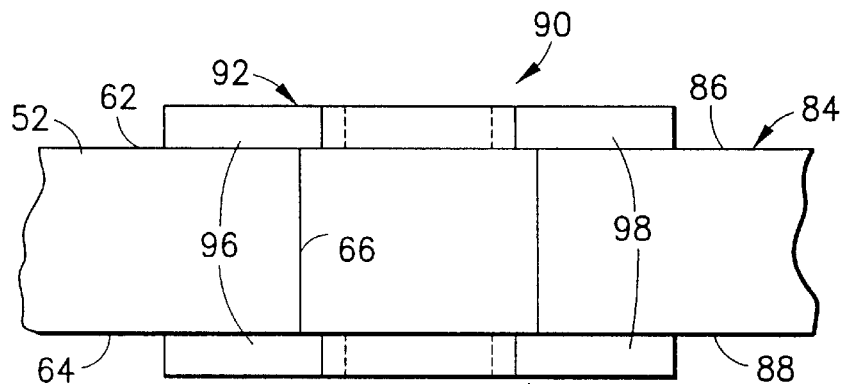
FIG. 6 is a detail side elevation view further enlarged over FIG. 4.

A bypass diode 84 is provided for protection of the solar cell 52 and, viewing FIG. 6, has a first surface 86 generally coplanar with the opposed surface 62 of the solar cell 52 and a second surface 88 generally coplanar with the opposed surface 64 of the solar cell.

An interconnect construction 90 (FIG. 6) serves to mount the bypass diode 84 on the solar cell 52 in a mutually coplanar relationship proximate to but spaced from the beveled edge 66 and to accommodate relative in-plane motion between the bypass diode and the solar cell. With this construction, the bypass diode 84 is electrically intermediate and in series with the conductors 68 and with the metallic coating which overlies the entire opposed surface 64. More specifically, viewing FIGS. 6 and 7, the interconnect construction 90 includes an upper interconnect member 92 which extends between and is fixed, respectively, to the metallic pad member 80 and to the first surface 86 of the bypass diode 84. In a similar fashion, a lower interconnect member 94, identical to the upper interconnect member, extends between and is fixed, respectively, to the metallic pad member 82 and to the second surface 88 of the bypass diode 84.

With continuing reference especially to FIGS. 4A, 4B, 6 and 7, each of the interconnect members includes first and second spaced apart mounting flanges 96, 98, the first flange being suitably joined, as by soldering, to the first metallic pad member 80, the second flange being similarly joined to the first surface 86 of the bypass diode. A stress relief member 100 extends between, is coplanar with, and is fixed at its opposite ends, respectively, to the mounting flanges 96 and 98.

Figure 7:
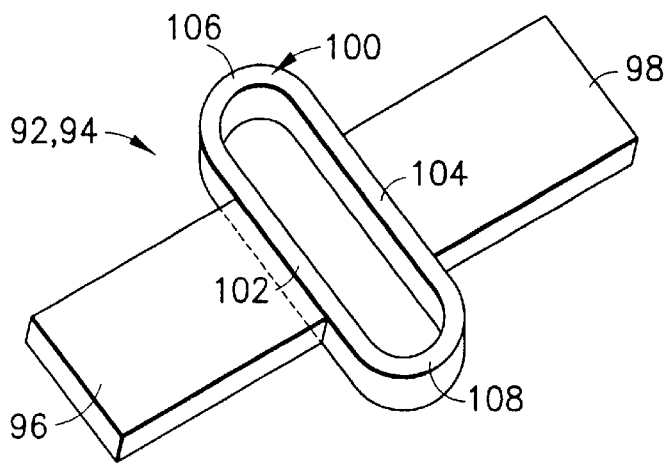
FIG. 7 is a detail perspective view of one embodiment of an interconnect construction for attaching a by-pass diode to a solar cell.

Viewing FIG. 7, each stress relief member 100 includes a resilient endless oval member of silver or other suitable conductive material, having opposed electrically conductive major legs 102, 104 and integral opposed minor legs 106, 108, the mounting flanges being aligned and joined, respectively, to the opposed major legs. With this construction, the stress relief member 100 can accommodate relative in-plane motion between the mounting flanges 96, 98 in the directions of their alignment.

Figure 8:
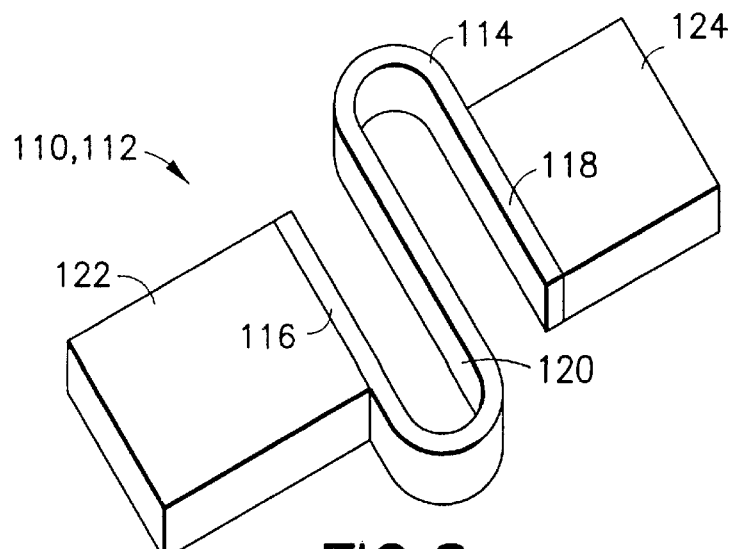
FIG. 8 is a detail perspective view of another embodiment of an interconnect construction for attaching a by-pass diode to a solar cell.

In another embodiment, viewing FIG. 8, each stress relief member 110, 112 includes a resilient electrically conductive S-shaped member having opposed legs 116, 118 and an integral bight member 120. Opposed mounting flanges 122, 124 are aligned and joined, respectively, to the opposed legs 116, 118, the stress relief member thereby accommodating relative in-plane motion between the first and second mounting flanges in the directions of their alignment.

Returning to FIGS. 4 and 5, in a preferred construction of the solar cell assembly 50, a protective glass sheet 126 of borosilicate or other suitable composition overlies the first opposed surface of the solar cell 52 and the bypass diode 84 and is generally coextensive with both of those components. Preferably, the glass sheet 126 is of chemically or thermally tempered glass having a thickness in the range of about 75 $\mu$m to about 550 $\mu$m. A layer 128 of adhesive intermediate the glass sheet 126 and the solar cell 52 and the by-pass diode 84 serves to bond the glass sheet, respectively, to the solar cell and to the diode.

Figure 9:
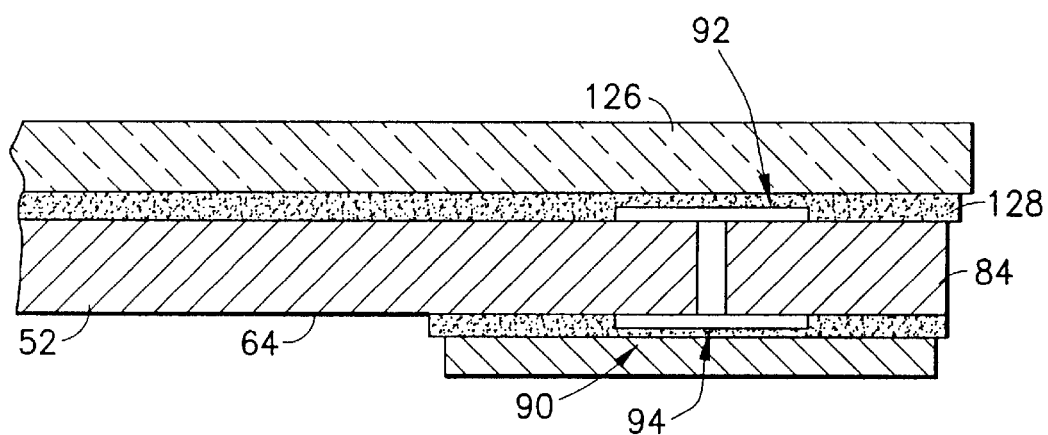
FIG. 9 is a detail side elevation view, similar to FIG. 5, illustrating another embodiment of the invention.

Turn now to FIG. 9 for the description of another embodiment of the invention. In this instance, a supplemental reinforcement sheet member 130 overlies a portion of the second opposed surface 64 of the solar cell 52 and the bypass diode 84 and is generally coextensive with the diode and with that portion of the surface 64. An intermediate layer 132 of suitable adhesive serves to bond the supplemental reinforcement sheet member 130 to the solar cell and to the diode. The sheet member 130 thus provides another expedient to provide the necessary strength for the solar cell assembly 50, by providing reinforcement opposite the glass sheet 126, at the back surface of the cell. The sheet member 130 may be a small triangular wafer of GFRP (graphite fiber reinforced plastic), for instance, approximately 20 mm by 20 mm legs bonded to the rear surface of the diode and the cell. Such a size and shape is sufficient for normal applications although other sizes may be required for specific applications. This wafer may be as thin as about 50 $\mu$m to 75 $\mu$m thick and become buried in the cell to substrate bonding adhesive 132. The electrical conductivity is of no concern since the rear surfaces are electrically connected by the interconnect. The proper selection of GFRP will enhance the thermal conductivity between the diode and cell and assist in controlling the operating temperature of the diode junction. For very severe conditions, a combination of two or more of the expedients mentioned, namely: thicker glass, tempered glass, and rear surface reinforcement, may be desirable or necessary.

While preferred embodiments of the invention have been disclosed in detail, it should be understood by those skilled in the art that various other modifications may be made to the illustrated embodiments without departing from the scope of the invention as described in the specification and defined in the appended claims.

What is claimed is:

1. A solar cell assembly with current limiting protection comprising:

a planar solar cell of rectangular shape having four corner locations including first and second opposed surfaces and a beveled edge at one of the corner locations;

first conductor means on the first opposed surface;

second conductor means on the second opposed surface;

a bypass diode for protection of the solar cell;

interconnect means mounting the bypass diode on the solar cell in a mutually coplanar relationship proximate to but spaced from the beveled edge, the interconnect means accommodating relative in-plane motion between the bypass diode and the solar cell, the bypass diode being electrically intermediate and in series with the first and second conductor means at the corner location containing the beveled edge of the rectangular-shaped solar cell, a phantom triangular-shaped element is defined which completes its ordinary outline; and the bypass diode is triangular and sized to fill the void defined by the phantom triangular-shaped element.

2. A solar cell assembly as set forth in claim 1 wherein the first conductor means includes:

a plurality of parallel spaced longitudinally extending conductors;

a bus member in electrical continuity with each of the conductors;

a first metallic pad member on a first opposed surface adjacent the beveled edge and electrically connected to the bus member;

wherein the second conductor means includes:

a metallic coating overlying the entire second opposed surface;

a second metallic pad member mounted on the second opposed surface adjacent the beveled edge and electrically connected to the metallic coating;

wherein the bypass diode has a first surface generally coplanar with the first opposed surface of the solar cell and a second surface generally coplanar with the second opposed surface of the solar cell; and wherein the interconnect means includes an upper interconnect member extending between and fixed, respectively, to the first metallic pad member and to the first surface of the bypass diode; and a lower interconnect member extending between and fixed, respectively, to the second metallic pad member and to the second surface of the bypass diode.

3. A solar cell assembly as set forth in claim 2 wherein the upper interconnect member includes:

first and second spaced apart mounting flanges, the first flange mounted to the first metallic pad member, the second flange mounted to the first surface of the bypass diode; and a stress relief member extending between, coplanar with, and fixed at its opposite ends, respectively, to the first and second mounting flanges of the upper interconnect member; and wherein the lower interconnect member includes:

first and second spaced apart mounting flanges, the first flange mounted to the second metallic pad member, the second flange mounted to the second surface of the bypass diode; and a stress relief member extending between, coplanar with, and fixed at its opposite ends, respectively, to the first and second mounting flanges of the lower interconnect member.

4. A solar cell assembly as set forth in claim 3 wherein each stress relief member includes a resilient endless oval member having opposed major legs and integral opposed minor legs, the mounting flanges being aligned and joined, respectively, to the opposed major legs, the stress relief member thereby accommodating relative in-plane motion between the first and second mounting flanges in the directions of their alignment.

5. A solar cell assembly as set forth in claim 3 wherein each stress relief member includes a resilient S-shaped member having opposed legs and an integral bight member, the mounting flanges being aligned and joined, respectively, to the opposed legs, the stress relief member thereby accommodating relative in-plane motion between the first and second mounting flanges in the directions of their alignment.

6. A solar cell assembly as set forth in claim 1 including:

a protective glass sheet overlying the first opposed surface of the solar cell and the bypass diode and coextensive therewith; and a layer of adhesive intermediate the glass sheet and the solar cell and the diode for bonding the glass sheet, respectively, to the solar cell and to the diode.

7. A solar cell assembly as set forth in claim 6 including:

a supplemental reinforcement sheet member overlying a portion of the second opposed surface of the solar cell and the bypass diode and coextensive with the diode and with the portion of the second opposed surface of the solar cell; and a layer of adhesive intermediate the supplemental reinforcement sheet member and the portion of the second opposed surface of the solar cell and the diode for bonding the supplemental reinforcement sheet member, respectively, to the solar cell and to the diode.

8. A solar cell assembly as set forth in claim 1 wherein the glass sheet is of chemically or thermally tempered glass.

9. A solar cell assembly as set forth in claim 1 wherein the glass sheet is of chemically or thermally tempered glass having a thickness in the range of about 75 $\mu$m to about 550 $\mu$m.

10. A solar cell assembly with current limiting protection comprising:

a planar solar cell generally of rectangular shape having four corner locations including first and second opposed surfaces and a beveled edge at one of the corner locations;

first conductor means on the first opposed surface;

second conductor means on the second opposed surface;

a bypass diode for protection of the solar cell;

interconnect means mounting the bypass diode on the solar cell in a mutually coplanar relationship proximate to but spaced from the beveled edge, the interconnect means accommodating relative in-plane motion between the bypass diode and the solar cell, the bypass diode being electrically intermediate and in series with the first and second conductor means; at the corner location containing the beveled edge of the rectangular-shaped solar cell, a phantom triangular-shaped element is defined which completes its ordinary outline; and the bypass diode is triangular and sized to fill the void defined by the phantom triangular-shaped element;

a protective glass sheet overlying the first opposed surface of the solar cell and the bypass diode and coextensive therewith; and a layer of adhesive intermediate the glass sheet and the solar cell and the diode for bonding the glass sheet, respectively, to the solar cell and to the diode.

11. A solar cell assembly as set forth in claim 10 wherein the first conductor means includes:
  a plurality of parallel spaced longitudinally extending conductors;
  a bus member in electrical continuity with each of the conductors;
  a first metallic pad member on the first opposed surface adjacent the beveled edge and electrically connected to the bus member;
wherein the second conductor means includes:
  a metallic coating overlying the entire second opposed surface;
  a second metallic pad member mounted on the second opposed surface adjacent the beveled edge and electrically connected to the metallic coating;
wherein the bypass diode has a first surface coplanar with the first opposed surface of the solar cell and a second surface generally coplanar with the second opposed surface of the solar cell; and
wherein the interconnect means includes
  an upper interconnect member extending between and fixed, respectively, to the first metallic pad member and to the first surface of the bypass diode; and
  a lower interconnect member extending between and fixed, respectively, to the second metallic pad member and to the second surface of the bypass diode.

12. A solar cell assembly as set forth in claim 11
wherein the upper interconnect member includes:
  first and second spaced apart mounting flanges, the first flange mounted to the first metallic pad member, the second flange mounted to the first surface of the bypass diode; and
  a stress relief member extending between, coplanar with, and fixed at its opposite ends, respectively, to the first and second mounting flanges of the upper interconnect member; and
wherein the lower interconnect member includes:
  first and second spaced apart mounting flanges, the first flange mounted to the second metallic pad member, the second flange mounted to the second surface of the bypass diode; and
  a stress relief member extending between, coplanar with, and fixed at its opposite ends, respectively, to the first and second mounting flanges of the lower interconnect member.

13. A solar cell assembly as set forth in claim 12
wherein each stress relief member includes a resilient endless oval member having opposed major legs and integral opposed minor legs, the mounting flanges being aligned and joined, respectively, to the opposed major legs, the stress relief member thereby accommodating relative in-plane motion between the first and second mounting flanges in the directions of their alignment.

14. A solar cell assembly as set forth in claim 12
wherein each stress relief member includes a resilient S-shaped member having opposed legs and an integral bight member, the mounting flanges being aligned and joined, respectively, to the opposed legs, the stress relief member thereby accommodating relative in-plane motion between the first and second mounting flanges in the directions of their alignment.

15. A solar cell assembly as set forth in claim 10 including:
  a supplemental reinforcement sheet member overlying a portion of the second opposed surface of the solar cell and the bypass diode and generally coextensive with the diode and with the portion of the second opposed surface of the solar cell; and
  a layer of adhesive intermediate the supplemental reinforcement sheet member and the portion of the second opposed surface of the solar cell and the diode for bonding the supplemental reinforcement sheet member, respectively, to the solar cell and to the diode.

16. A solar cell assembly as set forth in claim 10
wherein the glass sheet is of chemically or thermally tempered glass.

17. A solar cell assembly as set forth in claim 10
wherein the glass sheet is of chemically or thermally tempered glass having a thickness in the range of about 75 $\mu$m to about 550 $\mu$m.

* * * * *